(12) United States Patent
Yen

(10) Patent No.: US 9,431,714 B2
(45) Date of Patent: Aug. 30, 2016

(54) ANTENNA STRUCTURES

(71) Applicant: Taiwan Semiconductor Manufacturing Co., Ltd., Hsin-Chu (TW)

(72) Inventor: Hsiao-Tsung Yen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 744 days.

(21) Appl. No.: 13/733,164

(22) Filed: Jan. 3, 2013

(65) Prior Publication Data

US 2014/0184460 A1    Jul. 3, 2014

(51) Int. Cl.
*H01Q 1/38*    (2006.01)
*H01Q 9/16*    (2006.01)
*H01Q 13/10*   (2006.01)
*H01Q 7/00*    (2006.01)
*H01Q 1/22*    (2006.01)
*H01Q 9/04*    (2006.01)

(52) U.S. Cl.
CPC .............. *H01Q 9/16* (2013.01); *H01Q 1/2283* (2013.01); *H01Q 7/00* (2013.01); *H01Q 9/0407* (2013.01); *H01Q 13/106* (2013.01)

(58) Field of Classification Search
CPC ........ H01Q 1/38; H01Q 13/106; H01Q 9/16; H01Q 7/00; H01Q 9/18

USPC ......... 343/770, 767, 700 MS, 895, 793, 818, 343/866
See application file for complete search history.

(56) References Cited

U.S. PATENT DOCUMENTS

| | | | |
|---|---|---|---|
| 2007/0030201 A1* | 2/2007 | Tung | H01Q 1/242 343/702 |
| 2010/0127937 A1* | 5/2010 | Chandrasekaran | G06K 19/07775 343/700 MS |
| 2010/0148373 A1* | 6/2010 | Chandrasekaran | H01L 23/50 257/778 |
| 2010/0193935 A1* | 8/2010 | Lachner | H01Q 1/2283 257/693 |

* cited by examiner

*Primary Examiner* — Dameon E Levi
*Assistant Examiner* — Andrea Lindgreen Baltzell
(74) *Attorney, Agent, or Firm* — Duane Morris LLP

(57) ABSTRACT

An antenna formed on a semiconductor structure having a substrate with electrical circuits thereon operationally related to the functionality of an antenna and one or more metallic structures formed by a through silicon via, microbump, copper pillar, or redistribution layer proximate to the substrate. The one or more metallic structures form a radiating element of the antenna. Exemplary antennas thus formed can include a slot antenna, a WLAN slot antenna, a planar inverted F antenna (PIFA), a spiral antenna, a dipole antenna, a Yagi antenna, a planar dipole antenna, a vertical dipole antenna, a patch antenna, a helical antenna, a loop patch antenna, and combinations thereof.

20 Claims, 8 Drawing Sheets

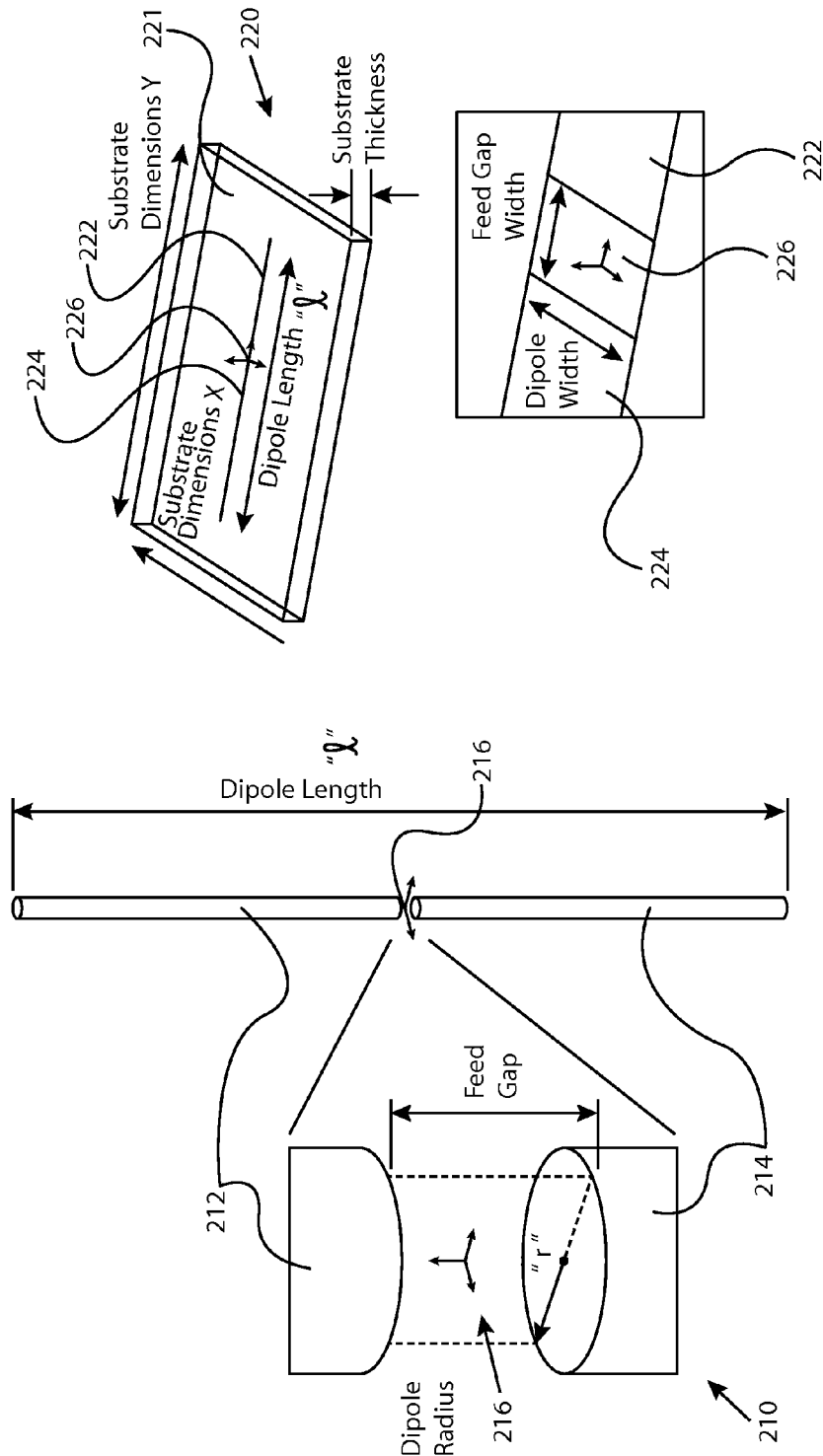

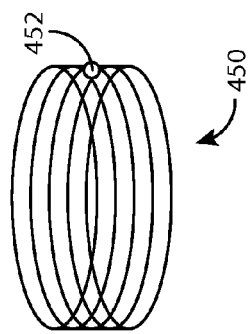
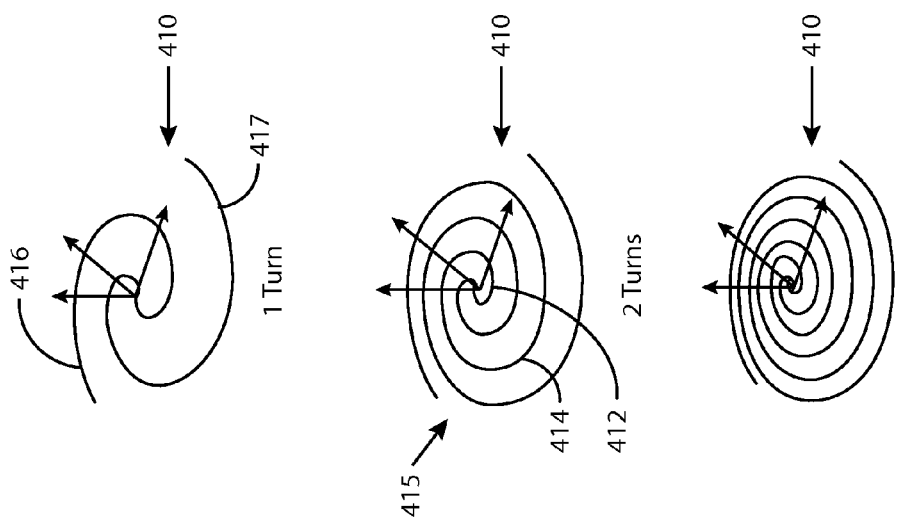
FIG. 4B
FIG. 4A

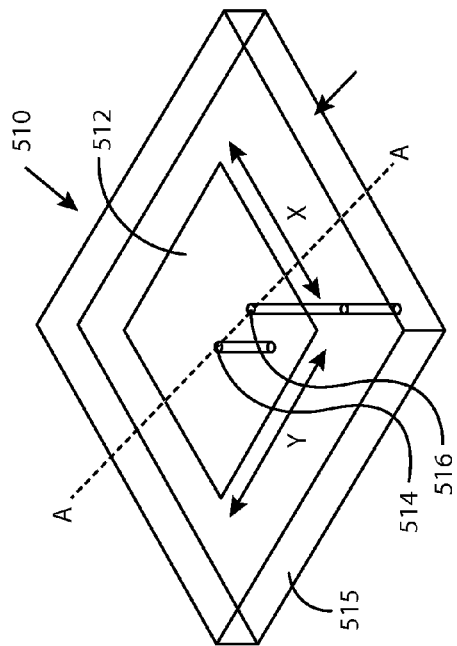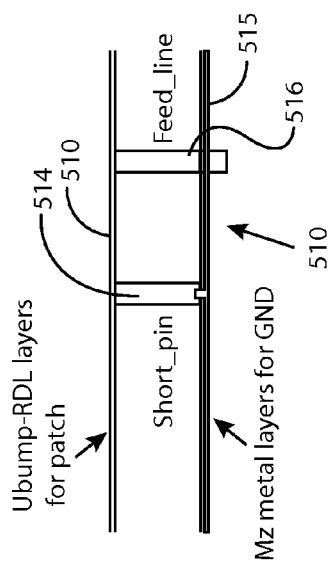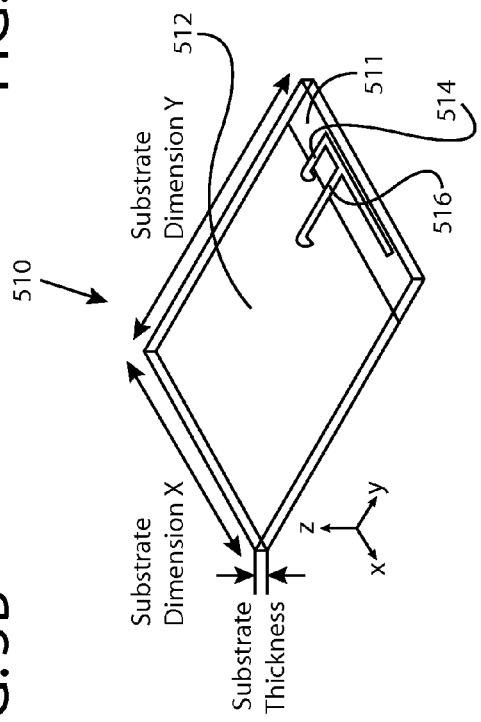
FIG. 5A
FIG. 5B
FIG. 5C

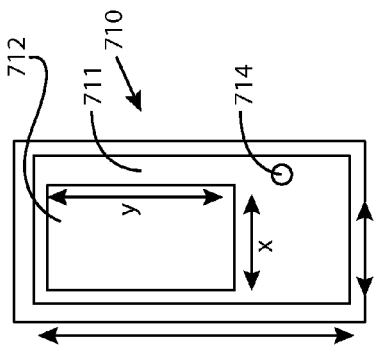
FIG. 7B
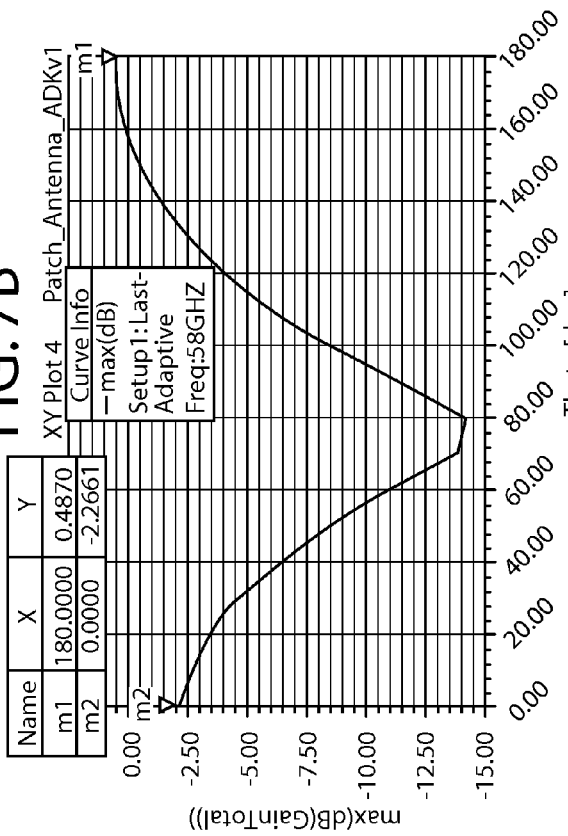
FIG. 7E
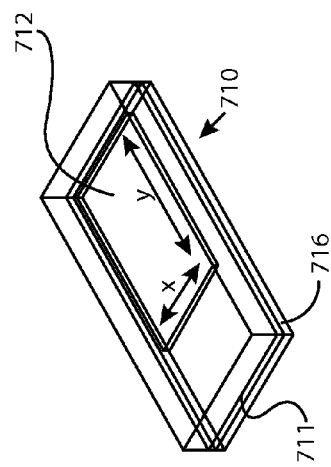
FIG. 7A
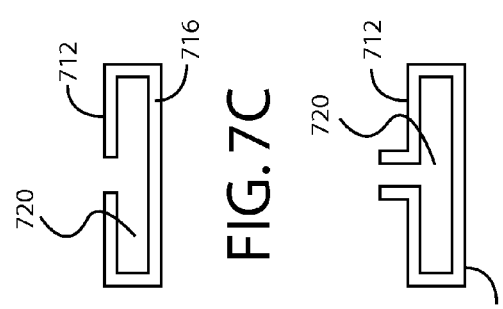
FIG. 7C
FIG. 7D

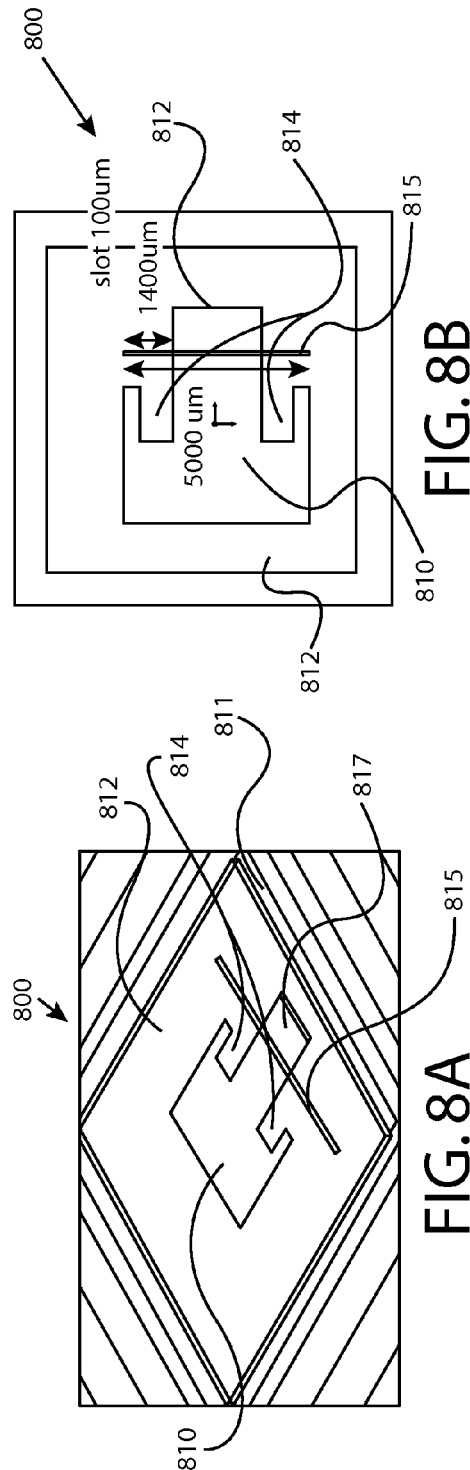
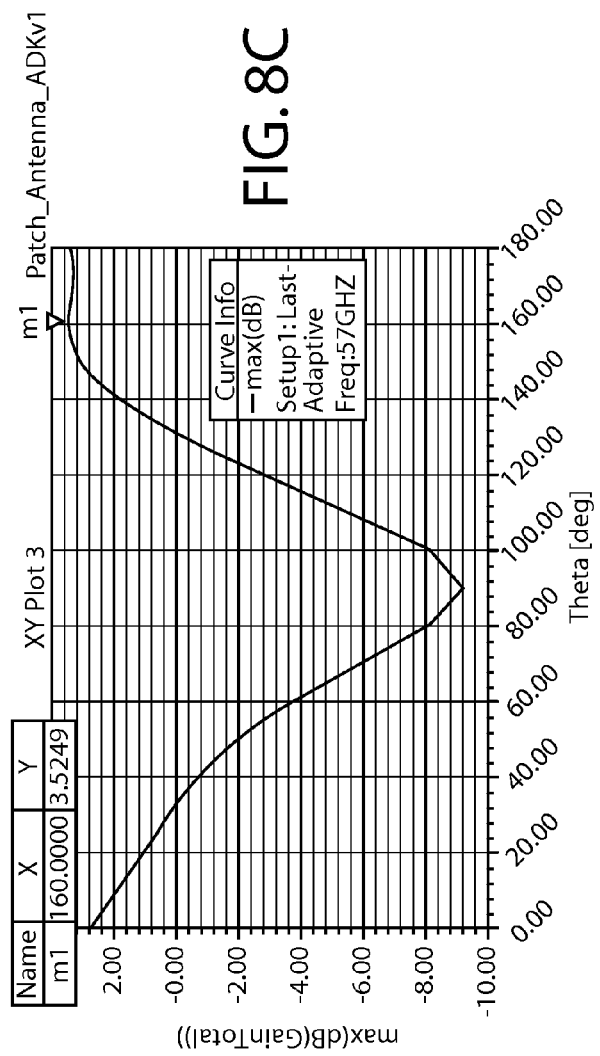
FIG. 8A
FIG. 8B
FIG. 8C

ANTENNA STRUCTURES

BACKGROUND

Semiconductor chips are continually being made smaller with the goals of increasing both device speed and circuit density. Miniaturized devices built within and upon a semiconductor substrate are spaced very closely together, and their packaging density continues to increase. As the packaging density increases, semiconductor chips are subject to electrical and physical limitations which stem from the reduced size of the areas available for their placement. Also, as products utilizing advanced electronics become more complex, they rely on larger numbers of semiconductor chips for their intended operation.

Underlying the complex nature of much sophisticated equipment is the need for communication between various semiconductor chips. As the space between chips available for signal conductor routing shrinks, the area available for communications conductors becomes increasingly limited while at the same time communications needs increase. One solution to this need for increased communications incorporates radio frequency (RF) signals for communicating within and between semiconductor chips.

Conventional semiconductor chips commonly employ integrated circuits (ICs) which operate at clock frequencies near the gigahertz frequency range. These ICs utilize on-chip and/or printed circuit board (PCB) wiring techniques for communication between active and passive circuit elements. As such clock frequencies are expected to extend high into the GHz range, and conventional wiring techniques exhibit inductive, resistive and capacitive delays which can significantly impair circuit performance. Further, performance of such on-chip or PCB components, e.g., on-chip antennas, is dominated by connections between the components and the respective complementary metal-oxide-semiconductor (CMOS) chip. Generally such connections are made by bond-wires, microbumps and the like.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features can be arbitrarily increased or reduced for clarity of discussion.

FIG. 2A is a diagram of vertical dipole antenna, according to an embodiment of the present disclosure.

FIG. 2B is a diagram of a planar dipole antenna according to another embodiment of the present disclosure.

FIG. 4A is an illustration of 2 and 3 turn planar spiral antennas.

FIG. 4B is an illustration of a helical antenna.

FIG. 5A is perspective view of an exemplary Planar Inverted F Antenna.

FIG. 5B is a cross section of the Planar Inverted F Antenna of FIG. 5B along line A-A.

FIG. 5C is an illustration of a PIFA having an edge fed shorting pin and/or feed line.

FIG. 7A is a perspective view of an exemplary loop patch antenna.

FIG. 7B is a top plan view of the antenna of FIG. 7A.

FIGS. 7C and 7D are cross-sections of exemplary loop patch antennas showing a relationship between the upper and lower patches.

FIG. 7E is a plot of the gain of the loop patch antenna of FIG. 7A at a frequency of 58 GHz.

FIGS. 8A and 8B are illustrations of an exemplary slot on patch antenna according to embodiments of the present disclosure.

FIG. 8C is a plot of the gain of the slot on patch antenna of FIGS. 8A-8B at a frequency of 57 GHz.

DETAILED DESCRIPTION

Figure 1:
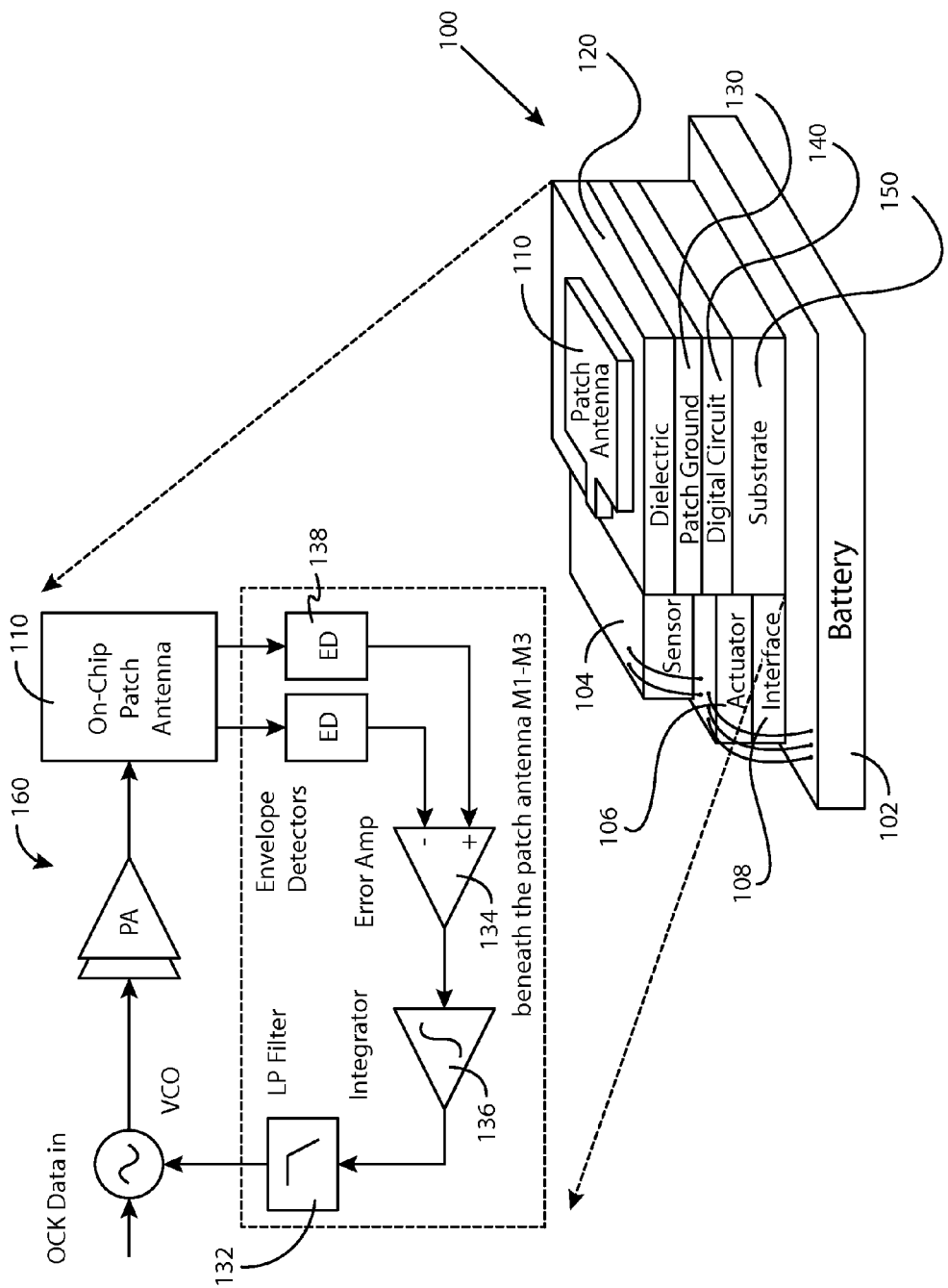
FIG. 1 is an illustration of an on-chip antenna and circuit diagram therefor.

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. Moreover, space orientation terms such as "under", "on", "up", "down", etc. are used to describe a relationship between a device or a characteristic and another device or another characteristic in the drawing. It should be noted that the space orientation term can cover different orientations of the device besides the orientation of the device illustrated in the drawing. For example, if the device in the drawing is turned over, the device located "under" or "below" the other devices or characteristics is reoriented to be located "above" the other devices or characteristics. Therefore, the space orientation term "under" may include two orientations of "above" and "below".

Various embodiments of the present disclosure can employ microbumps and/or redistribution layers (RDLs) to form an antenna. Microbumps are generally an electrical connection between dies for testing or other purposes. Microbump contact members can comprise metal bumps formed on an insulative layer. In additional embodiments of the present disclosure, microbumps can comprise one or more metal layers of varying thicknesses, e.g., 25 µm or more. Microbumps can also be formed on metal filled vias using an electroplating process as a microbump metal layer. Microbumps can comprise Tin (Sn), Silver (Ag), Copper (Cu), Chromium (Cr), Aluminum (Al), Nickel (Ni), Gold (Au), Titanium (Ti), Tungsten (W), and alloys thereof. An RDL is generally an additional metallic layer on a chip or die that makes the I/O pads of an IC available in other locations on the chip or die.

FIG. 1 is an illustration of an on-chip antenna and circuit diagram therefor. With reference to FIG. 1, an on-chip antenna 100 includes, in this example, an on-chip patch antenna 110 deposited on a dielectric layer 120. Underlying the patch antenna 110 are several layers, e.g., M1 through M3 layers, including a patch ground layer 130 and a layer including various digital circuits 140 overlying a substrate 150. An exemplary digital circuit layer 140 can include digital components such as, but not limited to, filters 132, amplifiers 134, integrators 136, detectors such as envelope detectors 138, and other components. These components can be used to receive and/or develop signals from or to an exemplary on-chip patch antenna 110 as appropriate. Additional circuitry and components can also be included for the antenna 110 including a battery 102, sensing circuitry 104, actuator circuitry 106, and interface circuitry 108. In the present example, an antenna-referenced frequency locked loop 160 is provided for a wireless sensor network.

FIG. 2A is a diagram of vertical dipole antenna 210 according to an embodiment of the present disclosure, and FIG. 2B is a diagram of a planar dipole antenna 220 according to another embodiment of the present disclosure. With reference to FIG. 2A, a vertical dipole antenna 210 having a length "l" can include two metal lines or rods 212, 214 substantially in line with each other, each line comprising any suitable metal. For example, non-limiting examples of suitable metals include Ag, Au, Al, Rh, Pt, Ni, Cu, Sn, Cr, Ti, W, heavily doped semiconductors, and alloys thereof. The two lines 212, 214 are separated by a feed gap 216 whereby an RF voltage can be applied to the antenna 210 at the feed gap 216. A center feeding element, e.g., a feed line (not shown), can be used to provide the necessary RF voltage to the antenna 210. In an embodiment were the dipole antenna 210 includes metal rods, the rod is provided with a radius r affecting a respective adjustment factor which, in turn, can affect the effective length and hence frequency of the dipole antenna.

With reference to FIG. 2B, a planar dipole antenna 220 having a length "l" can include two metal lines 222, 224 substantially in line with each other, each line comprising any suitable metal. Non-limiting examples of suitable metals include Ag, Au, Al, Rh, Pt, Ni, Cu, Sn, Cr, Ti, W, heavily doped semiconductors, and alloys thereof. In the depicted embodiment, the dipole antenna 220 is positioned or formed on a substrate 221. The two lines 222, 224 are separated by a feed gap 226 whereby an RF voltage can be applied to the antenna 220 at the feed gap 226. A center feeding element (not shown) can be used to provide the necessary RF voltage to the antenna 220. The dipole antennas 210, 220 depicted in FIGS. 2A and 2B can be formed using microbumps, through silicon vias (TSVs) and/or an RDL between dies with or without inter-metal layers in the respective upper or lower chips. By employing microbumps, copper pillars, TSVs, RDLs, and/or inter-metal layers in the upper or lower chips in such a manner, inductive, resistive and capacitive delays within a respective IC can be reduced. In some embodiments of the present disclosure, metal layers in adjacent dies can be used to form a parasitic element, e.g., director and/or reflector, in a Yagi antenna. In further embodiments, the thickness of an exemplary antenna can be more than 25 μm to thereby provide a low resistance.

Figure 3B:
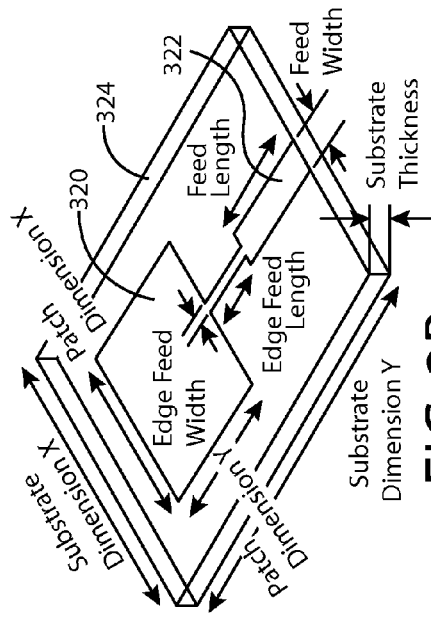
FIGS. 3A-3C are illustrations of exemplary patch antennas according to embodiments of the present disclosure.
Figure 3C:
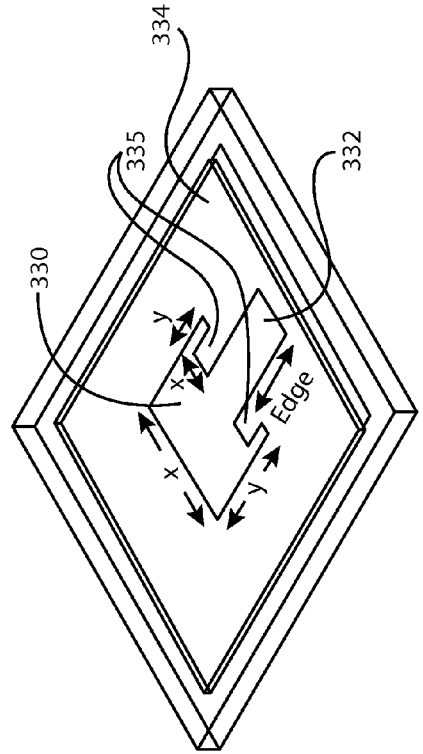
Figure 3D:
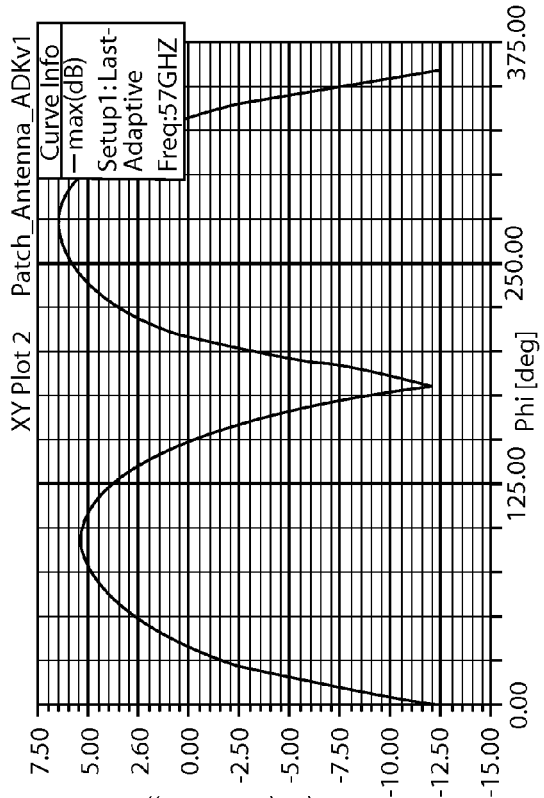
FIG. 3D is a plot of the gain of the patch antenna of FIG. 3C at a frequency of 57 GHz.
Figure 3A:
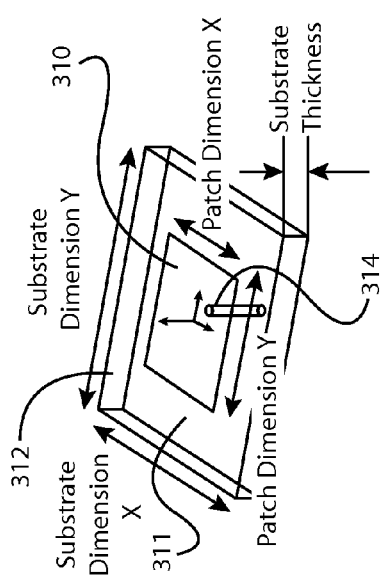

FIGS. 3A-3C are illustrations of exemplary patch antennas according to embodiments of the present disclosure. With reference to FIG. 3A, a patch antenna 310 can be formed on the surface of a dielectric substrate 312. The patch antenna 310 can be formed over a larger sheet of metal or ground plane 311 thus forming a resonant transmission line. While the patch antenna 310 illustrated in FIG. 3A is rectangular in form and possesses a vertical feed line 314, embodiments of the present disclosure should not be so limited. For example, FIG. 3B provides an illustration of another rectangular patch antenna 320 having an edge feed line 322 formed on a substrate 324. FIG. 3C provides an illustration of yet another patch antenna 330 formed on an oxide layer 334 having a ground plane below. Located at the same or another metal layer in chip, the patch antenna 330 includes an edge feed line 332 and also includes inset gaps 335 utilized for tuning of the antenna 330. While not shown, a silicon substrate underlies the depicted embodiment. In some embodiments, an exemplary patch antenna 330 includes an x dimension of approximately 3765 μm, a y-dimension of approximately 2788 μm, and an edge feed length of approximately 2900 μm. The inset gap x-dimension is approximately 770 μm and y-dimension is approximately 880 μm. Such dimensions, however, are exemplary and should not limit the scope of the claims appended herewith as actual antenna, size can depend upon which frequency is designed for radiation, e.g., the smaller size of the antenna design, the higher operating frequency for signal radiation. Exemplary patch antennas 310, 320, 330 can be formed of any suitable metal including, but not limited to, Ag, Au, Al, Rh, Pt, Ni, Cu, Sn, Cr, Ti, W, heavily doped semiconductors, and alloys thereof. FIG. 3D is a plot of the gain of the patch antenna of FIG. 3C at a frequency of 57 GHz. The patch antennas 310, 320, 330 depicted in FIGS. 3A-3C can be formed using microbumps, copper pillars. TSVs and/or an RDL between dies with or without inter-metal layers in the respective upper or lower chips. By employing microbumps, copper pillars, TSVs, RDLs and/or inter-metal layers in the upper or lower chips in such a manner, inductive, resistive and capacitive delays within a respective IC can be reduced.

FIGS. 4A and 4B are illustrations of exemplary spiral antennas according to embodiments of the present disclosure. FIG. 4A is an illustration of 1, 2 and 3 turn planar spiral antennas, and FIG. 4B is an illustration of a helical antenna. With reference to FIG. 4A, an exemplary planar spiral antenna 410 can include any number of turns and the depicted 1, 2 and 3 turn antennas are exemplary only. Further, in some embodiments the spiral element can include symmetrical arms 416, 417. An exemplary planar spiral antenna 410 includes a spiral element 415 with an innermost coil 412 and a central feed line (not shown). Adjacent coils 414 are spaced to selectively concentrate electromagnetic waves having a particular wavelength or range of wavelengths. In some embodiments, adjacent coils 414 are spaced apart from the innermost coil 412 and each other by approximately 1 μm to approximately 100 μm. Coils are generally spaced apart a distance sufficient to receive and/or transmit a wavelength of interest depending upon whether the respective antenna is a receiver, transmitter or transceiver. The spiral element 415 can be formed on a substrate layer using tape, patterned lines, and, in some embodiments of the present disclosure, can be formed in the spaces between dies using microbumps, copper pillars, TSVs, RDLs and/or inter-metal layers in the upper or lower chips. Non-limiting examples of suitable metals for the spiral element 415 include, Ag, Au, Al Rh, Pt, Ni, Cu, Sn, Cr, Ti, W, heavily doped semiconductors, and alloys thereof. With reference to FIG. 4B, an exemplary helical antenna 450 can include any number of turns having a predetermined pitch. Generally, the diameter and pitch of the helix determines the wavelength of the respective antenna. An exemplary, non-limiting diameter for a helix can range from approximately 10 μm to 500 μm. An exemplary, non-limiting pitch for a helix can range from approximately 1 μm to 100 μm. An exemplary helical antenna 450 comprises a conductive wire wound in the form of a helix and is positioned over a ground plane (not shown) in an underlying die or substrate. The antenna 450 also includes a feed line 452 connected between one end of the helix and the ground plane. Exemplary helical antennas 450 can operate in a normal or axial mode. The helical antennas 450 can be formed using microbumps, copper pillars, TSVs and/or structures on an RDL between dies with or without inter-metal layers in the upper or lower chips. By employing microbumps, copper pillars, TSVs, RDLs and/or inter-metal layers in the upper or lower chips in such a manner, inductive, resistive and capacitive delays within a respective IC can be reduced.

FIGS. 5A-5C are illustrations of exemplary planar inverted F antennas (PIFAs). FIG. 5A is a perspective view of an exemplary PIFA, and FIG. 5B is a cross section of the PIFA of FIG. 5B along line A-A. FIG. 5C is a perspective view of another PIFA according to other embodiments of the present disclosure. With reference to FIGS. 5A-5C, a PIFA 510 can be formed on the surface of a substrate 511 having a rectangular, square or other polygonal patch 512. In some embodiments of the present disclosure, the patch 512 of an exemplary PIFA is formed using microbump and/or RDL layers. Additionally, TSVs can be used to form exemplary PIFA antennas. In the depicted embodiment, the patch 512 includes an x dimension of approximately 530 μm and a y-dimension of approximately 530 μm. Such dimensions are exemplary only and should not limit the scope of the claims appended herewith. An exemplary PIFA 510 also includes a shorting pin 514 electrically connected to an underlying metal layer 515 or ground and a feed line 516. In some embodiments of the present disclosure, the shorting pin 514 and/or feed line 516 can be TSVs, copper pillars, or microbumps. PIFAs are generally resonant at a quarter-wavelength due to the positioning of the shorting pin 514 in relation to the feedline 516. Generally, the feed line 516 is positioned between an open end and shorting pin 514 and, as a function of its position controls input impedance to the antenna 500. While the shorting pin 514 is depicted as a line, exemplary shorting pins can be a plate, wire or other metallic structure. FIG. 5C is an illustration of a PIFA 510 having an edge fed shorting pin 514 and/or feed line 516. Exemplary PIFAs 510 can be formed of any suitable metal including, but not limited to, Ag, Au, Al, Rh, Pt, Ni, Cu, Sn, Cr, Ti, W, heavily doped semiconductors, and alloys thereof.

Figures 6A, 6B, 6C:
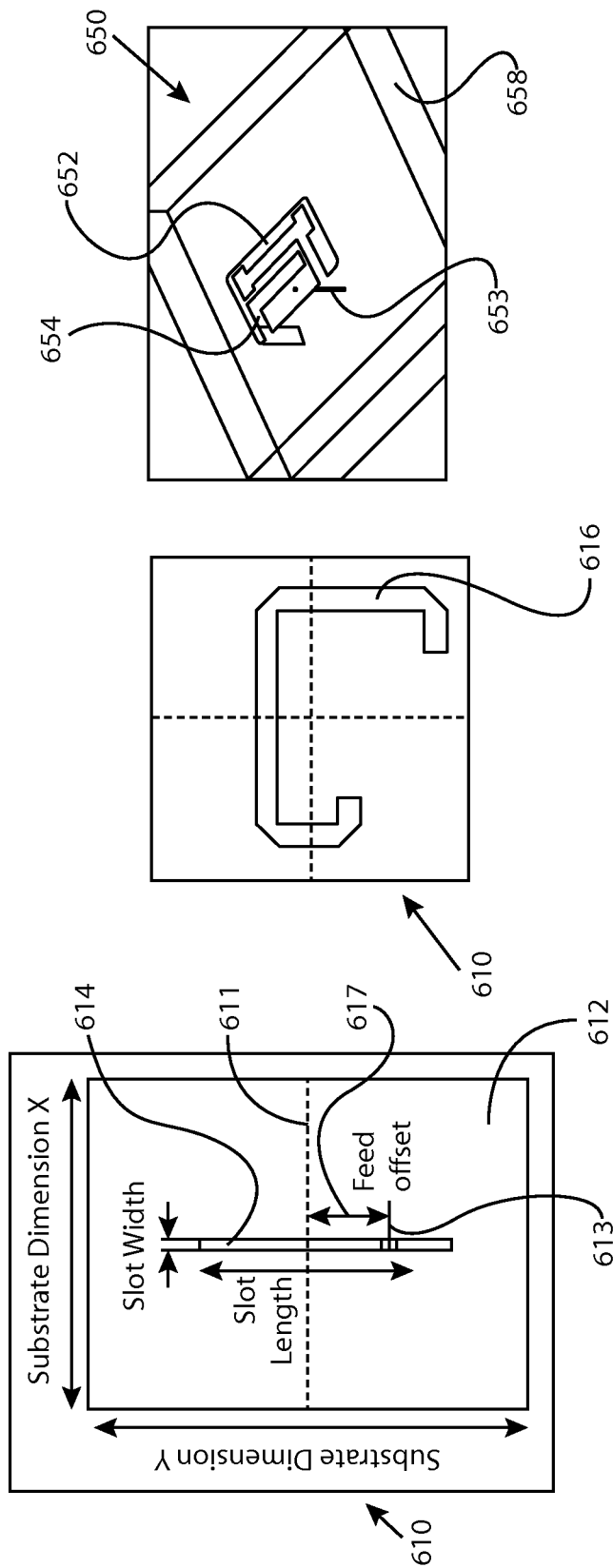
FIG. 6A is a top plan view of an exemplary slot antenna.
FIG. 6B is a top plan vie of a C-slot antenna.
FIG. 6C is a perspective view of a WLAN slot antenna.

FIG. 6A is a top plan view of an exemplary slot antenna. With reference to FIG. 6A, an exemplary slot antenna 610 includes a reference conductive layer, e.g., a ground layer, (not shown) and a radiating conductive layer 612 having one or more slots 614 formed therein. A feed line 613 is also provided for providing RF energy to an exemplary antenna, the feed line 613 offset by a predetermined distance 617 from a centerline 611 of the slot 614. The one or more slots 614 can be positioned or arranged in any of a variety of locations or arrangements in the radiating conductive layer 612 and the depicted arrangement should not limit the scope of the claims appended herewith. The radiating conductive layer 612 can be formed of any suitable metal including, but not limited to, Ag, Au, Al, Rh, Pt, Ni, Cu, Sn, Cr, Ti, W, heavily doped semiconductors, and alloys thereof. The one or more slots 614 can have any of a variety of shapes and dimensions (length, width, etc.), thus the depicted rectangular slot should not limit the scope of the claims appended herewith. For example, in some embodiments of the present disclosure, a C-shaped slot 616 is provided on the radiating conductive layer 612 as depicted in FIG. 6B. In some embodiments of the present disclosure, the radiating conductive layer 612 of an exemplary slot antenna is formed using microbump and/or RDL layers. Additionally, TSVs can be used to form exemplary portions of exemplary slot antennas. In additional embodiments, an exemplary slot antenna 610 can be a multilayer slot antenna, a cavity backed slot antenna, etc. FIG. 6C is a perspective view of a WLAN slot antenna. With reference to FIG. 6C, an exemplary WLAN slot antenna 650 includes a reference conductive layer 658, e.g., ground layer, and a radiating conductive layer 652 having a plurality of folded slots 654 formed therein. A feed line 653 is also provided for providing RF energy to an exemplary antenna. The plural folded slots 654 can be positioned or arranged in any of a variety of locations or arrangements in the radiating conductive layer 652 and the depicted arrangement should not limit the scope of the claims appended herewith. The radiating conductive layer 652 can be formed of any suitable metal including, but not limited to, Ag, Au, Al, Rh, Pt, Ni, Cu, Sn, Cr, Ti, W, and alloys thereof. The plural folded slots 654 can have any of a variety of shapes and dimensions (length, width, etc.), thus the depicted slots should not limit the scope of the claims appended herewith. In various embodiments of the present disclosure, the radiating conductive layer 652 is also formed using TSVs, microbumps, copper pillars, and/or RDL layers with or without inter-metal layers in the upper or lower chips.

FIGS. 7A-7E are illustrations of exemplary loop patch antennas according to embodiments of the present disclosure. FIG. 7A is a perspective view of an exemplary loop patch antenna 710, FIG. 7B is a top plan view of the antenna of FIG. 7A, and FIGS. 7C and 7D are cross-sections of exemplary loop patch antennas showing a relationship between the upper and lower patches. With reference to FIG. 7A, a loop patch antenna 710 includes an upper patch 712 formed on a substrate 711. In various embodiments, the upper patch 712 is formed using TSVs, microbumps, copper pillars, and/or RDL layers with or without inter-metal layers in the upper or lower chips. In some embodiments, the patch can have non-limiting x, y dimensions of 415 μm and 740 μm, respectively. On the surface of the substrate 711, an excitation or radiating port 714 is also provided. The loop patch antenna 710 also includes a lower patch 716 whereby the distance between the patches 712, 716 affects resonant frequency of the resulting antenna 710. The upper and lower patches 712, 716 can be formed of any suitable metal including, but not limited to, Ag, Au, Al, Rh, Pt, Ni, Cu, Sn, Cr, Ti, W, and alloys thereof. While not shown, shorting pins or plates can be provided for the upper patch 712. While the patches 712, 716 illustrated in FIGS. 7A-B are rectangular in form, embodiments of the present disclosure should not be so limited as the geometry of the patches can be any suitable polygon. In further embodiments of the present disclosure, the patches 712, 716 and/or respective shorting plates can be formed by TSVs, microbumps, copper pillars, and/or RDL layers with or without inter-metal layers in the upper or lower chips on opposing sides of a die 720 as illustrated in FIGS. 7C-7D. FIG. 7E is a plot of the gain of the loop patch antenna of FIG. 7A at a frequency of 58 GHz.

FIGS. 8A and 8B are illustrations of an exemplary slot on patch antenna 800 according to embodiments of the present disclosure. With reference to FIG. 8A, a patch antenna 810 can be formed on the surface of a dielectric substrate 812.

The patch antenna 810 can be formed over a larger sheet of metal or ground plane 811 thus forming a resonant transmission line. The patch antenna 810 can include an edge feed line 812 and inset gaps 817 utilized for tuning of the antenna 810. Exemplary patch antennas 810 can be formed of any suitable metal including, but not limited to, Ag, Au, Al, Rh, Pt, Ni, Cu, Sn, Cr, Ti, W, and alloys thereof. The slot on patch antenna 800 also includes one or more slots 815 formed in a portion or all of the patch antenna 810 which acts as a radiating conductive layer. The one or more slots 815 can be positioned or arranged in any of a variety of locations or arrangements in, through or about the patch antenna 810 and the depicted arrangement should not limit the scope of the claims appended herewith. The one or more slots 815 can have any of a variety of shapes and dimensions (length, width, etc.), thus the depicted rectangular slot should not limit the scope of the claims appended herewith. In the depicted embodiment, an exemplary slot has a length of 5000 µm, width of 100 µm, and an offset from the edge line 817 of 1400 µm. Of course, such dimensions are exemplary and should not limit the scope of the claims appended herewith. FIG. 8C is a plot of the gain of the slot on patch antenna of FIGS. 5A-8B at a frequency of 57 GHz.

Thus, with reference to the aforementioned figures, various embodiments of the present disclosure can provide an antenna formed on a semiconductor structure. The antenna includes a substrate having electrical circuits thereon operationally related to the functionality of the antenna and one or more metallic structures formed by TSVs or a microbump, or copper pillar or redistribution layer proximate to the substrate where the one or more metallic structures form a radiating element of the antenna. In some embodiments, the antenna is a slot antenna further including a reference conductive layer to emit electromagnetic energy in response to an electrical signal received at the reference conductive layer and a radiating conductive layer having at least one slot opening where the radiating conductive layer is formed by the TSVs, microbumps, copper pillars, or redistribution layer with or without inter-metal layers in the upper or lower chips. In other embodiments, the slot antenna is a WLAN slot antenna and the at least one slot opening includes a plurality of folded slots. In other embodiments of the present disclosure, the antenna is a PIFA having a polygonal antenna patch positioned on the substrate with at least one feed pin and at least one shorting pin extending therefrom whereby the shorting pin is used for electrical connection to a grounding layer and where the polygonal antenna patch is formed by the TSVs, microbumps, copper pillars, or redistribution layer or inter-metal layers in the upper or lower chips. In further embodiments, the antenna is a spiral antenna having a planar two arm spiral structure with one or more turns arranged to receive an RF signal. The two arms can be electrically isolated from each other and arranged to define a gap or feed point between the two arms whereby the spiral structure is formed by the TSVs, microbumps, copper pillars, or redistribution layer or inter-metal layers in the upper or lower chips. Some embodiments of the present disclosure provide a dipole (e.g., planar, vertical, Yagi, etc.) antenna having two metallic structures separated by a feed gap and a center feeding element providing radio frequency voltage to the metallic structures via the feed gap. The metallic structures are formed by the TSVs, microbumps, copper pillars or redistribution layer or inter-metal layers in the upper or lower chips. In the embodiments where the dipole antenna is a Yagi antenna, one or more metal layers in adjacent dies can form a director or reflector of the Yagi antenna.

In additional embodiments of the present disclosure, the antenna can be a patch antenna having a polygonal antenna patch positioned on the substrate with a feed element whereby the polygonal antenna patch is formed by the TSVs, microbumps, cooper pillars or redistribution layer or inter-metal layers in the upper or lower chips. The polygonal antenna patch can be any number of various patches including, but not limited to, a square patch, rectangular patch, hexagonal patch, pentagonal patch, and multisided patch having one or more gaps. In further embodiments, the patch antenna can include a reference conductive layer to emit electromagnetic energy in response to an electrical signal received at the reference conductive layer and at least one slot opening where the radiating conductive layer is formed by the polygonal antenna patch. Some embodiments of the present disclosure provide a helical antenna having a conductive structure wound in the form of a helix with a predetermined diameter and pitch and a ground plane whereby the conductive structure is formed by the TSVs, microbumpsm copper pillars, or redistribution layer or inter-metal layers in the upper or lower chips. Additional embodiments of the present disclosure provide a loop patch antenna having a first planar polygonal patch positioned on the substrate, a second planar polygonal patch substantially parallel to the first planar patch and separated from the first planar patch by a predetermined distance, and an excitation port supplying radio frequency energy to the antenna. In such embodiments, the first planar antenna patch can be formed by the TSVs, microbumps, copper pillars, or redistribution layer with or without inter-metal layers in the upper or lower chips and the predetermined distance can generally affect resonant frequency of the loop patch antenna. In other embodiments, the first and second planar patches are positioned on opposing sides of a die.

Additional embodiments of the present disclosure provide an antenna formed on a semiconductor structure having a substrate on a first die having electrical circuits thereon operationally related to the functionality of an antenna, a second die adjacent to the first die, and one or more structures formed in a space between the first and second dies. These one or more structures can form a radiating or receiving element of the antenna. In various embodiments, the one or more structures can be, but are not limited to, one or more TSVs, a microbump, an array of microbumps, a strip of microbumps, a layer of microbumps, one or more copper pillars, a redistribution layer, a plurality of redistribution layers, and combinations thereof. Exemplary antennas according to such embodiments are slot antennas, WLAN slot antennas, PIFAs, spiral antennas, dipole antennas, Yagi antennas, planar dipole antennas, vertical dipole antennas, patch antennas, helical antennas, loop patch antennas, and combinations thereof. Further, these one or more structures can comprise a material such as, but not limited to, silver, gold, aluminum, rhodium, platinum, nickel, copper, tin, chromium, titanium, tungsten, heavily doped semiconductors, and alloys thereof and can have a thickness of about 25 µm or more. Additional, embodiments of the present disclosure can provide a radiating element which radiates at a frequency of greater than 50 GHz.

While the figures heretofore have described embodiments of the present disclosure as they relate to slot, patch, and other antennas, the claims appended herewith should not be so limited as antennas can be any type of microstrip or transmission antenna utilizing TSVs, microbumps, copper pillars, and/or the RDL for portions or all of the respective antenna. Further, while single antennas have been depicted in the figures, embodiments of the present disclosure can be provided in antenna arrays and other designs.

It can be emphasized that the above-described embodiments, particularly any "preferred" embodiments, are merely possible examples of implementations, merely set forth for a clear understanding of the principles of the disclosure. Many variations and modifications can be made to the above-described embodiments of the disclosure without departing substantially from the spirit and principles of the disclosure. All such modifications and variations are intended to be included herein within the scope of this disclosure and the present disclosure and protected by the following claims.

Further, the foregoing has outlined features of several embodiments so that those skilled in the art can better understand the detailed description that follows. Those skilled in the art should appreciate that they can readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they can make various changes, substitutions and alterations herein without departing from the spirit and scope of the present disclosure.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous.

As shown by the various configurations and embodiments illustrated in FIGS. 1-8C, various antenna structures have been described.

While preferred embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

I claim:

1. A semiconductor structure comprising:
  a first die including a substrate having electrical circuits thereon operationally related to the functionality of an antenna; and
  a planar redistribution layer (RDL) parallel to a top surface of the substrate, the RDL having a planar polygonal antenna patch between the first die and a second die, the polygonal antenna patch parallel to the substrate and having a pair of lines extending away from the polygonal antenna patch on one side thereof, and an edge feed line extending from the one side of the polygonal antenna patch, with a respective inset gap between the edge feed line and each respective line of the pair of lines.

2. The antenna of claim 1 wherein the antenna
the radiating conductive layer comprises at least one slot opening.

3. An antenna formed on a semiconductor structure comprising:
  a first die having a semiconductor substrate and electrical circuits thereon operationally related to the functionality of an antenna, the first die having a plurality of metal layers over the substrate and parallel to a face of the substrate,
  a redistribution layer that is an additional layer parallel to the substrate and located over the plurality of metal layers;
  a second die over the redistribution layer of the first die, the redistribution layer having one or more structures between the first and second dies,
  wherein the one or more structures include a planar polygonal patch antenna parallel to the face of the substrate.

4. The antenna of claim 3, wherein the antenna is a planar invented F antenna (PIFA) further comprising:
  a polygonal antenna patch positioned on the substrate having at least one feed pin and at least one shorting pin extending therefrom, the shorting pin used for electrical connection to a grounding layer,
  wherein the polygonal antenna patch is formed by the redistribution layer.

5. The antenna of claim 3, wherein the antenna is a spiral antenna further comprising:
  a planar two arm spiral structure having one or more turns and arranged to receive an RF signal,
  wherein the two arms are electrically isolated from each other and arranged to define a gap or feed point between the two arms,
  and wherein the spiral structure is formed by the redistribution layer.

6. The antenna of claim 3, wherein the antenna is a dipole antenna comprising:
  two metallic structures separated by a feed gap; and
  a center feeding element providing radio frequency voltage to the metallic structures via the feed gap,
  wherein the metallic structures are formed by the redistribution layer.

7. The antenna of claim 6 wherein the dipole antenna is a planar or vertical dipole antenna.

8. The antenna of claim 6 wherein the dipole antenna is a Yagi antenna and wherein one or more metal layers in adjacent dies form a director or reflector of the Yagi antenna.

9. The antenna of claim 3, wherein the antenna is a patch antenna comprising:
  a polygonal antenna patch positioned on the substrate having a feed element,
  wherein the polygonal antenna patch is formed by the redistribution layer.

10. The antenna of claim 9 wherein the polygonal antenna patch is selected from the group consisting of a square patch, rectangular patch, hexagonal patch, pentagonal patch, and multisided patch having one or more gaps.

11. The antenna of claim 3, further comprising:
  a reference conductive layer to emit electromagnetic energy in response to an electrical signal received at the reference conductive layer; and
  at least one slot opening,
  wherein the radiating conductive layer is formed by the polygonal antenna patch.

12. The antenna of claim 3, wherein the antenna is a helical antenna further comprising:
  a conductive structure wound in the form of a helix having a predetermined diameter and pitch; and
  a ground plane,
  wherein the conductive structure is formed by the redistribution layer.

13. The antenna of claim 3, wherein the antenna is a loop patch antenna comprising:

a first planar polygonal patch positioned on the substrate;

a second planar polygonal patch substantially parallel to the first planar patch and separated from the first planar patch by a predetermined distance; and an excitation port supplying radio frequency energy to the antenna, wherein the first planar antenna patch is formed by the microbump, through silicon via, copper pillar, or redistribution layer, and wherein the predetermined distance affects resonant frequency of the loop patch antenna.

14. The antenna of claim 13 wherein the first and second planar patches are positioned on opposing sides of a die.

15. The antenna of claim 3, wherein the slot antenna is a WLAN slot antenna and the at least one slot opening comprises a plurality of folded slots.

16. The antenna of claim 3 further comprising one or more through silicon vias, a microbump, an array of microbumps, a strip of microbumps, a layer of microbumps, one or more copper pillars, inter-metal layers in an upper or lower chip, and combinations thereof.

17. The antenna of claim 3 wherein the antenna is selected from the group consisting of a slot antenna, a WLAN slot antenna, a planar invented F antenna (PIFA), a spiral antenna, a dipole antenna, a Yagi antenna, a planar dipole antenna, a vertical dipole antenna, a patch antenna, a helical antenna, a loop patch antenna, and combinations thereof.

18. The antenna of claim 3 wherein the one or more structures comprise a material selected from the group consisting of silver, gold, aluminum, rhodium, platinum, nickel, copper, tin, chromium, titanium, tungsten, heavily doped semiconductors, and alloys thereof.

19. The antenna of claim 3 wherein the radiating element has a thickness of about 25 µm or more.

20. The antenna of claim 3 wherein the radiating element radiates at a frequency of greater than 50 GHz.

* * * * *